United States Patent
Lim et al.

(10) Patent No.: US 11,877,463 B2
(45) Date of Patent: Jan. 16, 2024

(54) LIGHT EMITTING DISPLAY DEVICE

(71) Applicant: LG DISPLAY CO., LTD., Seoul (KR)

(72) Inventors: Dong Hyeok Lim, Paju-si (KR); Bo Seong Kim, Yongin-si (KR); Hwa Yong Shin, Goyang-si (KR); Ji Hyung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 419 days.

(21) Appl. No.: 17/336,875

(22) Filed: Jun. 2, 2021

(65) Prior Publication Data
US 2022/0209160 A1 Jun. 30, 2022

(30) Foreign Application Priority Data
Dec. 31, 2020 (KR) .......................... 10-2020-0190046

(51) Int. Cl.
| | |
|---|---|
| *H10K 50/17* | (2023.01) |
| *H10K 50/15* | (2023.01) |
| *H10K 59/12* | (2023.01) |
| *H10K 85/60* | (2023.01) |

(52) U.S. Cl.
CPC ............. *H10K 50/17* (2023.02); *H10K 50/15* (2023.02); *H10K 59/12* (2023.02); *H10K 85/60* (2023.02); *H10K 85/615* (2023.02); *H10K 85/6572* (2023.02); *H10K 85/6574* (2023.02)

(58) Field of Classification Search
None
See application file for complete search history.

(56) References Cited

U.S. PATENT DOCUMENTS

| | | | |
|---|---|---|---|
| 2002/0158574 A1* | 10/2002 | Wolk | H04N 13/337 313/506 |
| 2005/0063175 A1 | 3/2005 | Mizusaki et al. | |
| 2010/0263727 A1* | 10/2010 | Oyamada | H10K 30/211 257/E51.012 |
| 2013/0074920 A1* | 3/2013 | Echegoyen | B82Y 30/00 977/948 |
| 2016/0104853 A1* | 4/2016 | Holmes | H10K 30/40 136/255 |
| 2017/0077425 A1* | 3/2017 | Ma | C09K 11/025 |
| 2017/0365801 A1* | 12/2017 | Margulies | H10K 85/346 |

FOREIGN PATENT DOCUMENTS

| | | |
|---|---|---|
| KR | 10-0934522 B1 | 12/2009 |
| KR | 10-2014-0016329 A | 2/2014 |

OTHER PUBLICATIONS

"Highly efficient fluorescent blue materials and their applications for top-emission OLEDs" by Masuda et al. (Year: 2018).*

* cited by examiner

*Primary Examiner* — Evren Seven
(74) *Attorney, Agent, or Firm* — Birch, Stewart, Kolasch & Birch, LLP

(57) ABSTRACT

Discussed is a light emitting display device which enables a common layer having high hole conductivity among common layers in respective stacks to include a material having a high orientation factor value so as to prevent generation of leakage current between subpixels and ensure high efficiency and a long lifespan.

17 Claims, 13 Drawing Sheets

High orientation in film

Random orientation

High orientation in film

LIGHT EMITTING DISPLAY DEVICE

CROSS-REFERENCE TO RELATED APPLICATIONS

This application claims the priority benefit of Korean Patent Application No. 10-2020-0190046, filed in the Republic of Korea on Dec. 31, 2020, the entire contents of which are hereby incorporated by reference as if fully set forth herein into the present application.

BACKGROUND OF THE INVENTION

Field of the Invention

The present invention relates to a light emitting display device, and more particularly, to a light emitting display device which has common layers configured to adjust orientation between stacks in a structure including a plurality of stacks so as to prevent leakage current between adjacent subpixels.

Discussion of the Related Art

As our society has recently entered the information age, the field of displays for visually displaying electrical information signals has rapidly developed. In order to satisfy such development, various display devices having excellent performance, such as slimness, light weight and low power consumption, have been developed and have rapidly replaced conventional cathode ray tubes (CRTs).

Among the various display devices, light emitting display devices, which do not require separate light sources, achieve compactness and clear color display and include light emitting devices within a display panel, are considered as competitive applications.

A light emitting device including a plurality of stacks is considered in order to improve efficiency, but because the number of common layers in respective subpixels is great and leakage current flows towards adjacent subpixels, when the subpixels configured to emit light of a specific color are driven, light of another undesirable color may be emitted.

SUMMARY OF THE INVENTION

Accordingly, the present invention is directed to a light emitting display device, which changes common layers in respective stacks, that substantially obviates one or more problems due to limitations and disadvantages of the related art.

An object of the present invention is to provide a light emitting display device which enables a common layer having high hole conductivity among common layers in respective stacks to include a material having a high orientation factor value so as to prevent generation of leakage current between subpixels and to ensure high efficiency and a long lifespan.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a light emitting display device includes a substrate configured to have a plurality of subpixels, an anode provided in each of the subpixels, a cathode provided throughout the subpixels opposite the anode, a first stack and a second stack provided between the anode and the cathode so as to be divided by a charge generation layer and configured such that each of the first and second stack includes an emission layer, and a hole injection layer provided between the anode and the first stack so as to contact the anode and to have an orientation factor S' of less than or equal to 0.8, wherein the first stack includes a first hole transport layer configured to contact the hole injection layer and to have an orientation factor S' of greater than or equal to 0.84.

In another aspect of the present invention, a light emitting display device includes a substrate configured to have first to third subpixels, first to third anodes respectively provided in the first to third subpixels, a cathode provided throughout the first to third subpixels opposite the first to third anodes, a first stack and a second stack divided from each other by an n-type charge generation layer provided between the first to third anodes and the cathode, a first p-type charge generation layer provided between the n-type charge generation layer and the second stack in the first subpixel, and a second p-type charge generation layer provided between the n-type charge generation layer and the second stack in each of the second and third subpixels so as to have an orientation factor S' less than an orientation factor S' of the first p-type charge generation layer, wherein each of the first to third subpixels includes corresponding ones of first color emission layers, second color emission layers and third color emission layers in the first stack and the second stack, and the turn-on voltage of the first subpixel is lower than the turn-on voltages of the second and third subpixels.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE EMBODIMENTS

Figure 1:
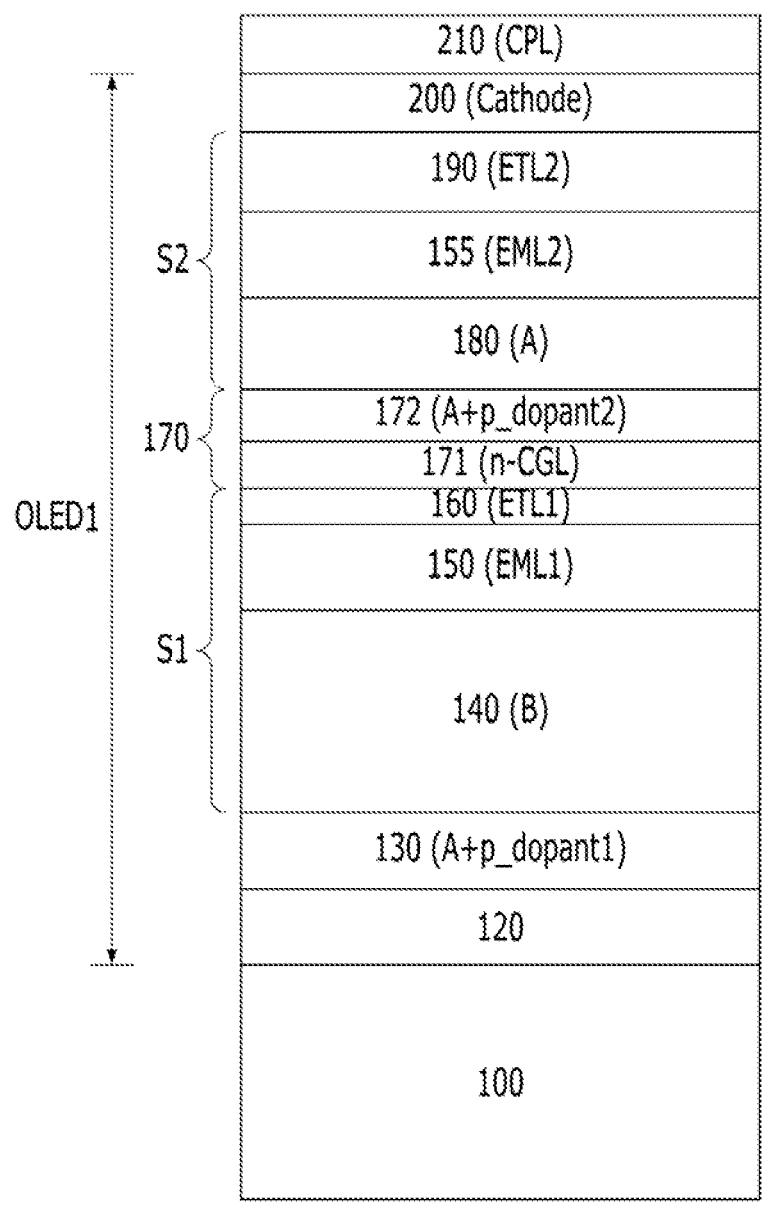
FIG. 1 is a cross-sectional view illustrating a light emitting device according to a first embodiment of the present invention.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it can make the subject matter of the present invention rather unclear. Further, the names of elements used in the following description of the embodiments of the present invention are selected in consideration of ease of preparation of the specification, and can thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In the interpretation of elements included in the various embodiments of the present invention, it is to be interpreted that quantitative descriptions of characteristics of the elements include error ranges unless stated otherwise.

In the following description of the embodiments, it will be understood that, when positional relationships are expressed, for example, when an element is said to be "on", "above", "under" or "beside" another element, the two elements can directly contact each other, or one or more other elements can be interposed between the two elements, unless the term "just" or "directly" is used.

In the following description of the embodiments, it will be understood that, when temporal relationships are expressed, for example, when terms expressing a sequence of events, such as "after", "subsequent to", "next" and "before" are used, the terms encompass both a continuous relationship between the events and a discontinuous relationship between the events, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention can be partially or wholly coupled to or combined with each other and be interlocked or driven in various technical manners, and the respective embodiments can be implemented independently of each other or be implemented together through connection therebetween.

In the following description of the embodiments, the term "doped" can preferably mean that the content of a material having properties different from a material occupying the majority of the weight of a corresponding layer (materials having different properties being, for example, N-type and P-type materials or an organic material and an inorganic material), which is added to the material occupying the majority of the weight of the corresponding layer, is less than 30 wt %. In other words, a "doped" layer can preferably mean a layer in which a host material and a dopant material can be discriminated from each other based on a ratio of the weight percents thereof.

In addition, the term "undoped" can preferably mean all cases other than the case corresponding to the term "doped". For example, if a layer is formed of a single material or is formed of a mixture of materials having the same or similar properties, the layer can be an "undoped" layer. For example, if at least one of materials forming a layer is P-type and none of the materials forming the layer are N-type, the layer is an "undoped" layer. For example, if at least one of materials forming a layer is organic and none of the materials forming the layer are inorganic, the layer is an "undoped" layer. For example, if all of the materials forming a layer are organic and at least one of the materials forming the layer is N-type and at least another of the other materials is P-type, when the content of the N-type material is less than 30 wt % or the content of the P-type material is less than 30 wt %, the layer is a "doped" layer.

In the following description of the embodiments, an electroluminescence (EL) spectrum is calculated by multiplying (1) a photoluminescence (PL) spectrum, in which the intrinsic properties of a light emitting material, such as a dopant material or a host material included in an organic light emitting layer, are reflected, by (2) an out-coupling emittance spectrum curve which is determined by the structure and optical properties of an organic light emitting device including the thicknesses of organic layers, such as an electron transport layer.

FIG. 1 is a cross-sectional view illustrating a light emitting device according to a first embodiment of the present invention. All the components of the light emitting device according to all embodiments of the present invention are operatively coupled and configured. In all embodiments, an example of a light emitting device is referred to an OLED (organic light emitting diode), but is not limited thereto.

As shown in FIG. 1, a light emitting device OLED1 according to the first embodiment of the present invention includes an anode 120 provided on a substrate 100, a cathode 200 provided throughout a plurality of subpixels opposite the anode 120, a first stack S1 and a second stack S2 provided between the anode 120 and the cathode 200 so as to be divided by a charge generation layer 170 and configured to respectively include emission layers 150 (EML1) and 155 (EML2), and a hole injection layer 130 (A_+p_dopant1) which is provided between the anode 120 and the first stack S1 so as to contact the anode 120 and has an orientation factor S' of less than or equal to 0.8.

Further, the first stack S1 can include a first hole transport layer 140 (B) which contacts the hole injection layer 130 and has an orientation factor S' of exceeding 0.8, for example, greater than or equal to 0.84. The orientation factor S' of the hole injection layer may be less than the orientation factor S' of the first hole transport layer In more detail, the first stack S1 includes the first hole transport layer 140, a first emission layer 150 and a first electron transport layer 160 (ETL1), and the second stack S2 includes a second hole transport layer 180 (A), a second emission layer 155 and a second electron transport layer 190 (ETL2).

The charge generation layer 170 includes an n-type charge generation layer 171 (n-CGL) and a p-type charge generation layer 172 (A+p_dopant2).

In a light emitting display device using the light emitting device OLED1 according to the first embodiment of the present invention, the anode 120 is patterned so as to correspond to each respective subpixel, and the first and second stacks S1 and S2, the charge generation layer 170 and the cathode 200 are provided in common. The light emitting devices OLED1 of the respective subpixels of the light emitting display device according to the first embodiment of the present invention have the configuration shown in FIG. 1, and differ from one another in terms of colors of light emitted by the emission layers thereof.

In one subpixel, the colors of light emitted by the emission layers 150 and 155 of the first and second stacks S1 and S2 are the same, and the reason for this is to increase efficiency of the corresponding color of the emitted light through a plurality of stacks.

In the light emitting device shown in FIG. 1, the anode 120 includes a reflective electrode, the cathode 200 includes a transflective electrode, and light emitted by the emission layers 150 and 155 between the anode 120 and the cathode 200 is resonated while repeating reflection and re-reflection by the facing surfaces of the anode 120 and the cathode 200, and thus each subpixel is capable of emitting light with a strong microcavity effect.

Here, the anode 120 is patterned so as to correspond to each subpixel, and the cathode 200 opposite the anode 120 is formed in an integral type throughout all the subpixels.

A capping layer 210 (CPL) can be provided on the cathode 200 so as to increase the luminous efficacy of light emitted by the light emitting device OLED1 and to protect the light emitting device OLED1. The light emitting device OLED1 generally includes elements from the anode 120 to the cathode 200, but can further include the capping layer 210 based on optical characteristics related to the light emitting device OLED1 and process continuity.

Now, the orientation factor S' of a specific layer given in the description will be described with reference to the following figures.

Figure 2A:
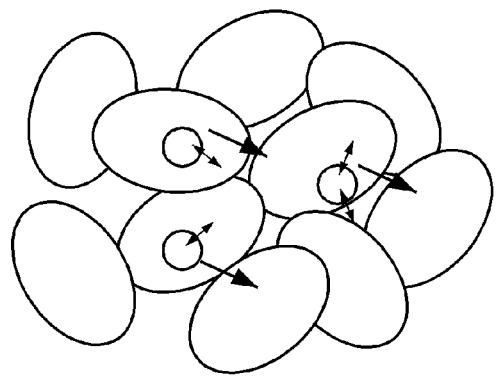
FIG. 2A is a view illustrating orientation characteristics of a first material A included in a hole injection layer, a p-type charge generation layer and a second hole transport layer shown in FIG. 1.
Figure 2B:
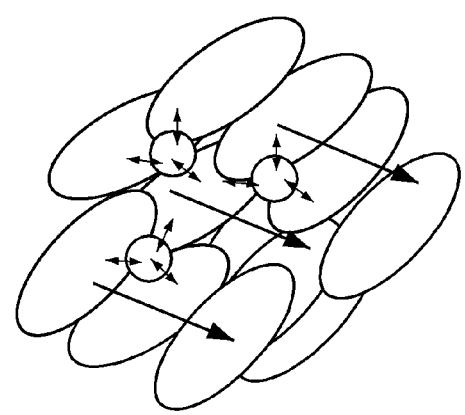
FIG. 2B is a view illustrating orientation characteristics of a second material B included in a first hole transport layer shown in FIG. 1.
Figure 3A:
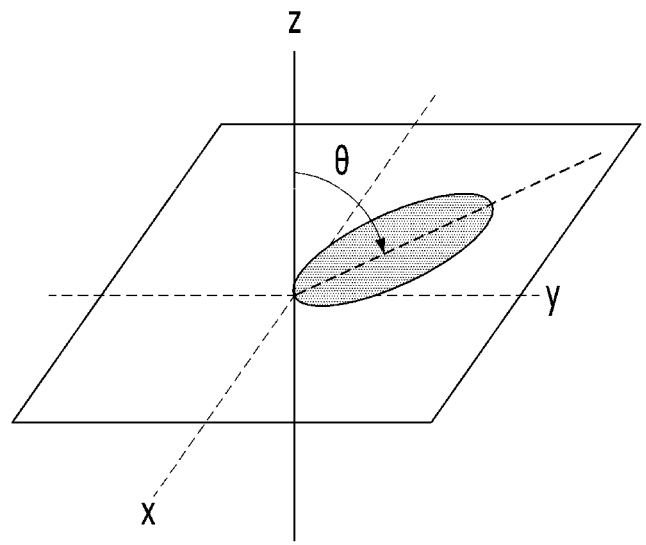
FIG. 3A is a view illustrating an angle θ used by orientation factors S and S'.
Figure 3B:
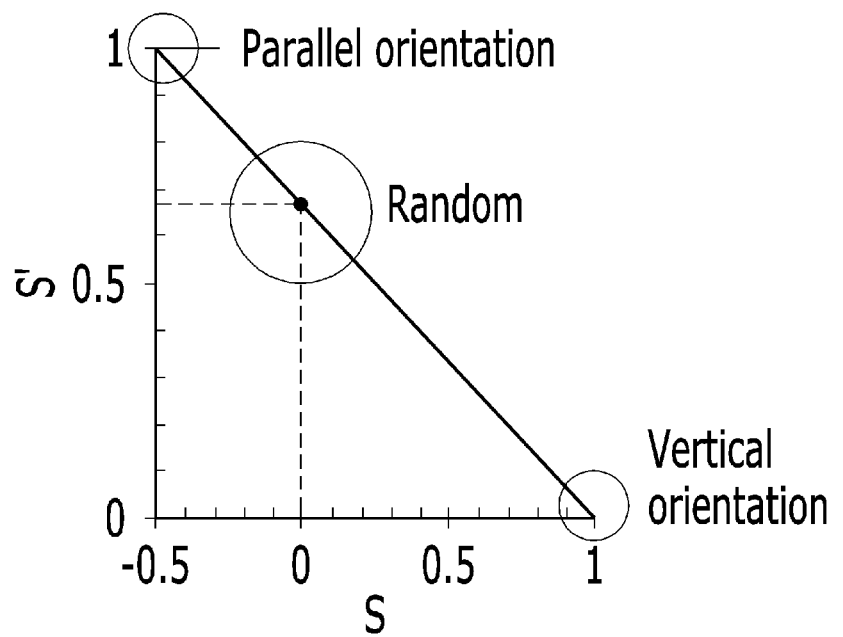
FIG. 3B is a graph showing the relationships between the orientation factors S and S'.

FIG. 2A is a view illustrating orientation characteristics of a first material (A) included in the hole injection layer, the p-type charge generation layer and the second hole transport layer shown in FIG. 1, and FIG. 2B is a view illustrating orientation characteristics of a second material B included in the first hole transport layer shown in FIG. 1. FIG. 3A is a view illustrating an angle θ used by orientation factors S and S', and FIG. 3B is a graph showing the relationships between the orientation factors S and S'.

In the light emitting device and the light emitting display device including the same according to the first embodiment of the present invention, the hole injection layer 130, the p-type charge generation layer 172, and the second hole transport layer 180 of the second stack S2 include the first material A having a low orientation factor S' and thus having a random orientation, as shown in FIG. 2A.

Particularly, the hole injection layer 130 includes the first material A as a host, and the hole injection layer 130 further includes 30 wt % of a first p-type dopant in the first material A.

A reason why the hole injection layer 130 includes the first material A having the random orientation is that the hole injection layer 130, which includes the first p-type dopant and thus high conductivity, includes the first material A having a high degree of orientational freedom, as a main material, i.e., a host, so as to reduce lateral leakage current towards adjacent subpixels. Here, the first material A has the random orientation and thus shortens a current movement path between molecules in the hole injection layer 130, thereby being capable of reducing leakage current towards the adjacent subpixels.

On the other hand, the first hole transport layer 140 located on the hole injection layer 130 includes the second material B having a relatively high orientation, as shown in FIG. 2B. As shown in FIG. 2B, a distance between molecules is short due to a regular arrangement of the molecules, and thus, a current path is formed along the adjacent molecules and current transmission is easy. For example, because the first hole transport layer 140 has a greater thickness than other layers so as to form an optical distance in the first stack S1 and thereby the first hole transport layer 140 in the first stack S1 has a greater vertical distance than the other layers, the first hole transport layer 140 is important in current transmission between the anode 120 and the cathode 200. In the light emitting device according to the present invention, the first hole transport layer 140 includes the second material B having regular molecular arrangement so as to effectively transmit current in the vertical direction.

The electrical conductivity of the second material B of the first hole transport layer 140 is lower than that of the p-type dopant of the hole injection layer 130. Therefore, even though the first hole transport layer 140 has a large orientation factor value, lateral leakage current caused by the first hole transport layer 140 does not occur.

In the above-described structure, the p-type charge generation layer 172 and the second hole transport layer 180 of the second stack S2 come into contact with each other and respectively include a material having a low orientation regularity (for example, the first material A) as main materials thereof, but are not limited to use of the same material. As needed, the p-type charge generation layer 172 and the second hole transport layer 180 of the second stack S2 can have different orientation factors S', the p-type charge generation layer 172 can further include an additional material which functions to generate holes and to transmit the holes to an adjacent stack, and the second hole transport layer 180 of the second stack S2 can further include an additional material which functions to effectively transport holes to the second emission layer 155 of the second stack S2. The embodiments of the present invention are characterized in that both the p-type charge generation layer 172 and the second hole transport layer 180 respectively use materials having low orientation regularity, the materials having low orientation regularity means that materials have an orientation factor S' of less than or equal to 0.80, and other materials can be used as long as the orientation factors S' thereof are less than or equal to 0.80.

The orientation factors S' and the orientation factor S used herein will be described with reference to Equations 1 and 2 below and FIGS. 3A and 3B.

When the orientation factor S of a material is defined, as shown in FIG. 3A, an angle of molecules forming the material from the Z-axis is referred to as θ, an extinction coefficient of the material in the x-y plane is referred to as $k_x$, and an extinction coefficient of the material on the Z-axis is referred to as $k_z$. The extinction coefficients $k_x$ and $k_z$ are values which are measured at a wavelength of 420 nm, and respectively correspond to orientation parallel to and orientation vertical to a substrate.

$$S = \frac{3\langle\cos^2\theta\rangle - 1}{2} = \frac{k_z - k_x}{k_z + 2k_x} \quad \text{[Equation 1]}$$

$$S' = 1 - \langle\cos^2\theta\rangle = \frac{2k_x}{k_z + 2k_x} \quad \text{[Equation 2]}$$

When the orientation factor S' is considered based on Equation 2 above, as the molecules get close to the Z-axis, i.e., as the molecules are oriented vertically, the orientation factor S' is decreased.

$$S' = \tfrac{2}{3}(1-S) \quad \text{[Equation 3]}$$

Further, referring to FIG. 3B, as the value of the orientation factor S is changed from −0.5 to 1, the value of the orientation factor S' is proportional to the value of the orientation factor S at a slope of −⅔, as set forth in Equation 3 above. In this case, when the orientation factor S is 0, the orientation factor S' has a value corresponding to ⅔. Referring to FIG. 3B, as the orientation factor S' approaches 1, the molecules exhibit a parallel orientation state and has have higher regularity, and as the orientation factor S' approaches 0, the molecules are more randomly arranged.

The inventors of the present invention found out that, when the first material A having random orientation, included in the hole injection layer 130, the p-type charge generation layer 172 and the second hole transport layer 180, has an orientation factor S' of less than or equal to 0.8, the first material A is effective.

In contrast, it was observed through tests that the second material B having high orientation regularity can be a material having an orientation factor S' exceeding 0.8, and more particularly, can be a material having an orientation factor S' of greater than or equal to 0.84.

For example, in terms of the orientation factor S', carbazole-based materials, dibenzofuran-based materials and biphenyl-based materials are used as the second material B having high orientation regularity which can be used as hole transporting material. The orientation factor S' of the carbazole-based materials is 0.89, the orientation factor S' of the dibenzofuran-based materials is 0.92, and the orientation factor S' of biphenyl-based materials is 0.84.

In contrast, fluorene-based materials are used as the first material A having an orientation factor S' of less than or equal to 0.8. The orientation factor S' of fluorene-based materials is 0.79.

The above-described materials having an orientation factor S' of less than or equal to 0.8 are only examples, and as needed, other materials acquired by changing the substituents or the molecular structures of these materials can be additionally used.

When the orientation characteristics of the first and second hole transport layers 140 and 180, the p-type charge generation layer 172 and the hole injection layer 130 according to an example of the present invention are described, a criterion for determining a material having high molecular orientation regularity is whether or not the orientation factor S' of the material exceeds 0.8. In the light emitting device according to an example of the present invention, the first material A having random molecular orientation employs a material having an orientation factor S' of less than or equal to 0.8, and the second material B having regular molecular orientation employs a material having an orientation factor S' exceeding 0.8, more particularly a material having an orientation factor S' of greater than or equal to 0.84.

The inventors of the present invention confirmed through tests that the hole injection layer 130, the p-type charge generation layer 172 and the second hole transport layer 180 include the disclosed first material A so as to reduce leakage current. The results of these tests will be described below.

Now, other embodiments of the present invention will be described.

Figure 4:
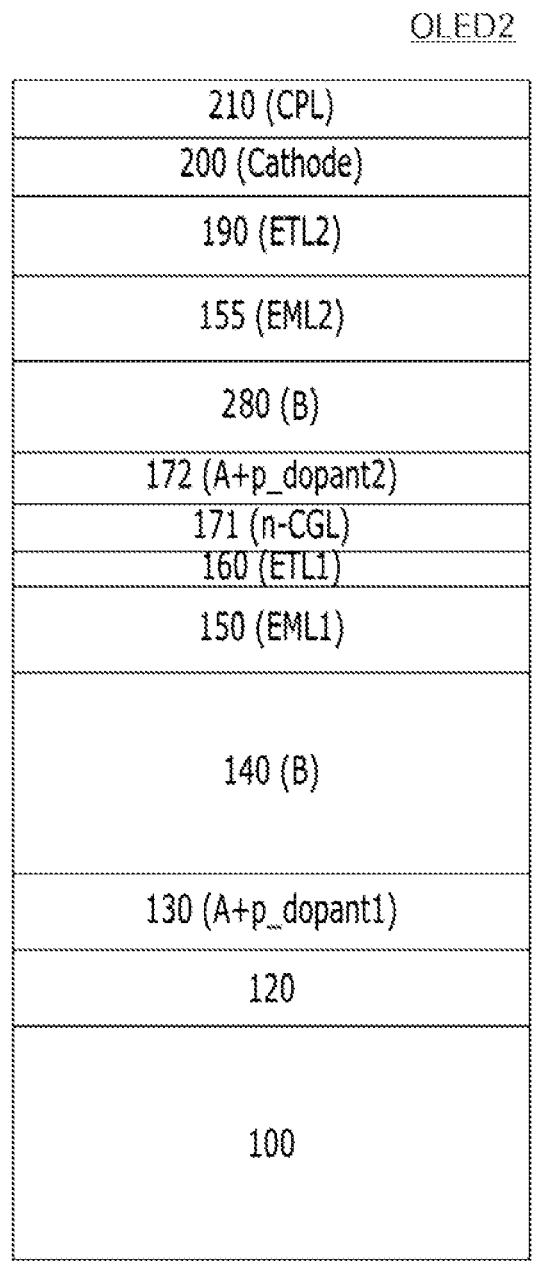
FIG. 4 is a cross-sectional view illustrating a light emitting device according to a second embodiment of the present invention.

FIG. 4 is a cross-sectional view illustrating a light emitting device according to a second embodiment of the present invention.

As shown in FIG. 4, in a light emitting device OLED2 according to the second embodiment of the present invention, a second hole transport layer 280 (B) of a second stack S2 includes the second material B of FIG. 2B having high orientation regularity, and other elements of the light emitting device OLED2 are the same as those of the light emitting device OLED1 according to the first embodiment of the present invention.

Each of the light emitting device OLED1 according to the first embodiment and the light emitting device OLED2 according to the second embodiment of the present invention can be connected to a thin film transistor on the substrate 100 so as to be provided in each of the subpixels, thereby being capable of forming a light emitting display device. The stack structures of the respective subpixels of the light emitting display device can have a corresponding one of the configurations shown in FIGS. 1 and 4 except that the emission layers of the stacks in the respective subpixels are different.

Figure 5:
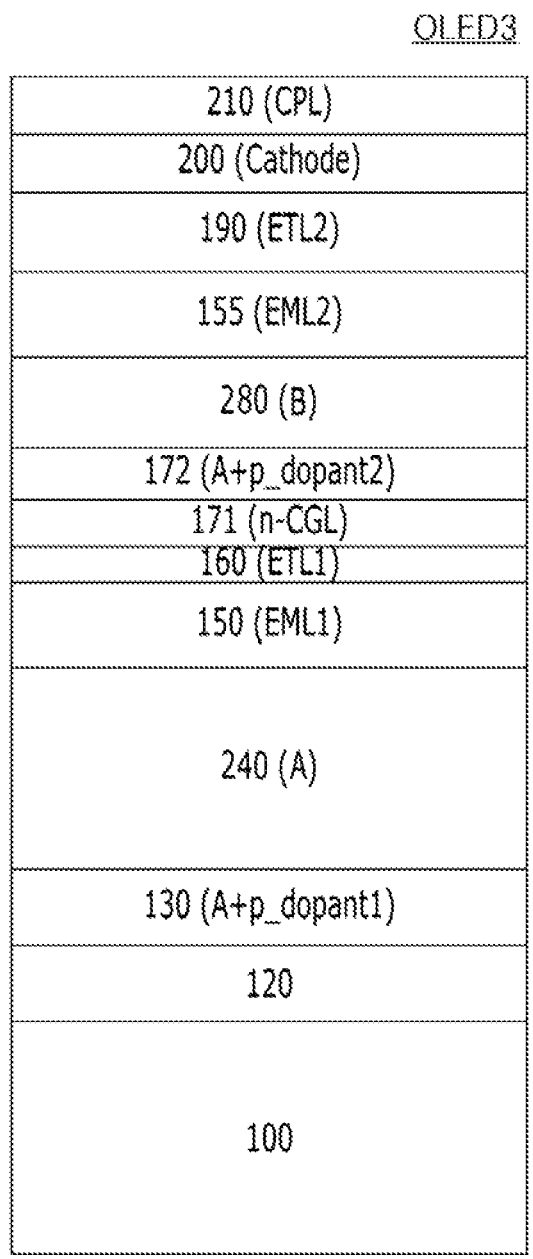
FIG. 5 is a cross-sectional view illustrating a light emitting device according to a third embodiment of the present invention.

FIG. 5 is a cross-sectional view illustrating a light emitting device according to a third embodiment of the present invention.

As shown in FIG. 5, a light emitting device OLED3 according to the third embodiment of the present invention has the same configuration as the light emitting device OLED1 according to the first embodiment, except that a first hole transport layer 240 (A) of a first stack S1 contacting a hole injection layer 130 includes the first material A having low orientation regularity, and a second hole transport layer 280 (B) of a second stack S2 includes the second material B having high orientation regularity.

Figure 6:
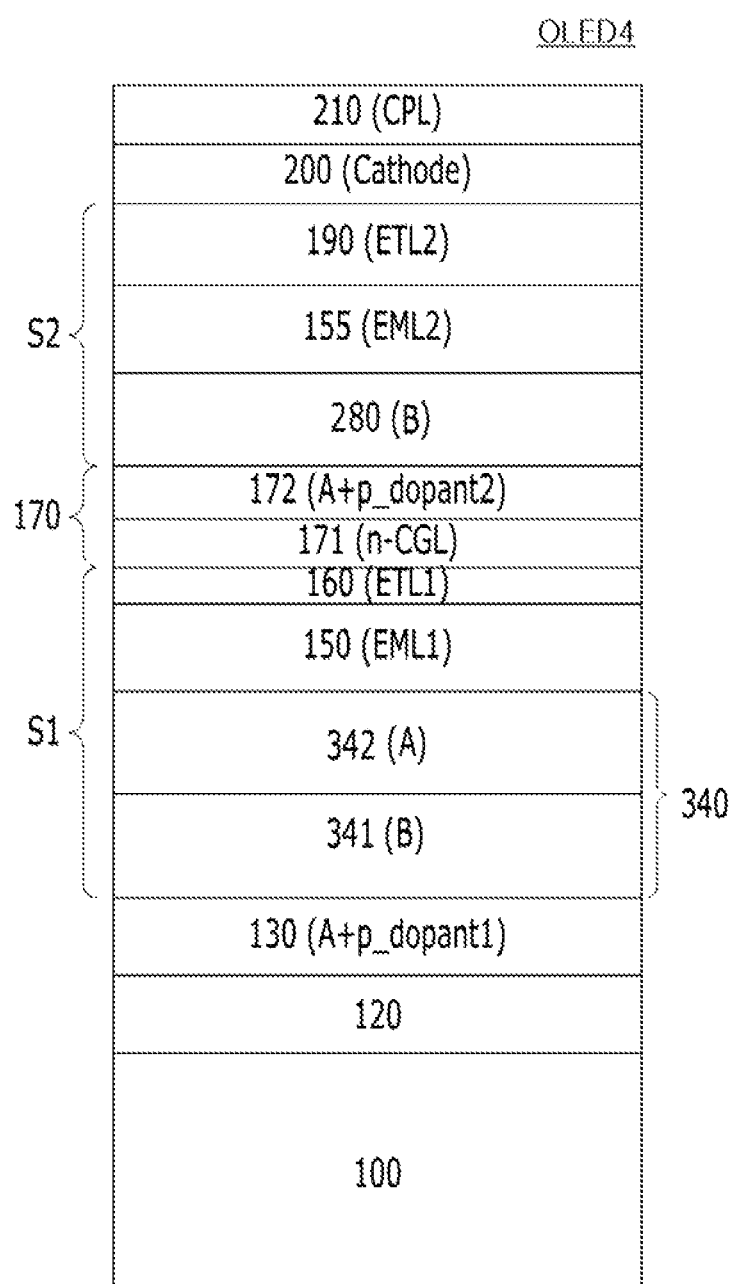
FIG. 6 is a cross-sectional view illustrating a light emitting device according to a fourth embodiment of the present invention.

FIG. 6 is a cross-sectional view illustrating a light emitting device according to a fourth embodiment of the present invention.

As shown in FIG. 6, a light emitting device OLED4 according to the fourth embodiment of the present invention has the same configuration as the light emitting device OLED1 according to the first embodiment, except that a first hole transport layer 340 of a first stack S1 contacting a hole injection layer 130 includes a plurality of layers 341 (B) and 342 (A), and a second hole transport layer 280 (B) of a second stack S2 includes the second material B having high orientation regularity.

In more detail, the first hole transport layer 340 is formed by sequentially stacking a first layer 341 including the second material B having high orientation regularity on the hole injection layer 130 and a second layer 342 including the first material A having low orientation regularity on the first layer 341.

In the light emitting device OLED4 according to the fourth embodiment of the present invention, the first layer 341 increases alignment in orientation in the direction of the organic stack, thereby being capable of preventing lateral leakage current of the second layer 342 without disturbing generation of vertical current.

Figure 7:
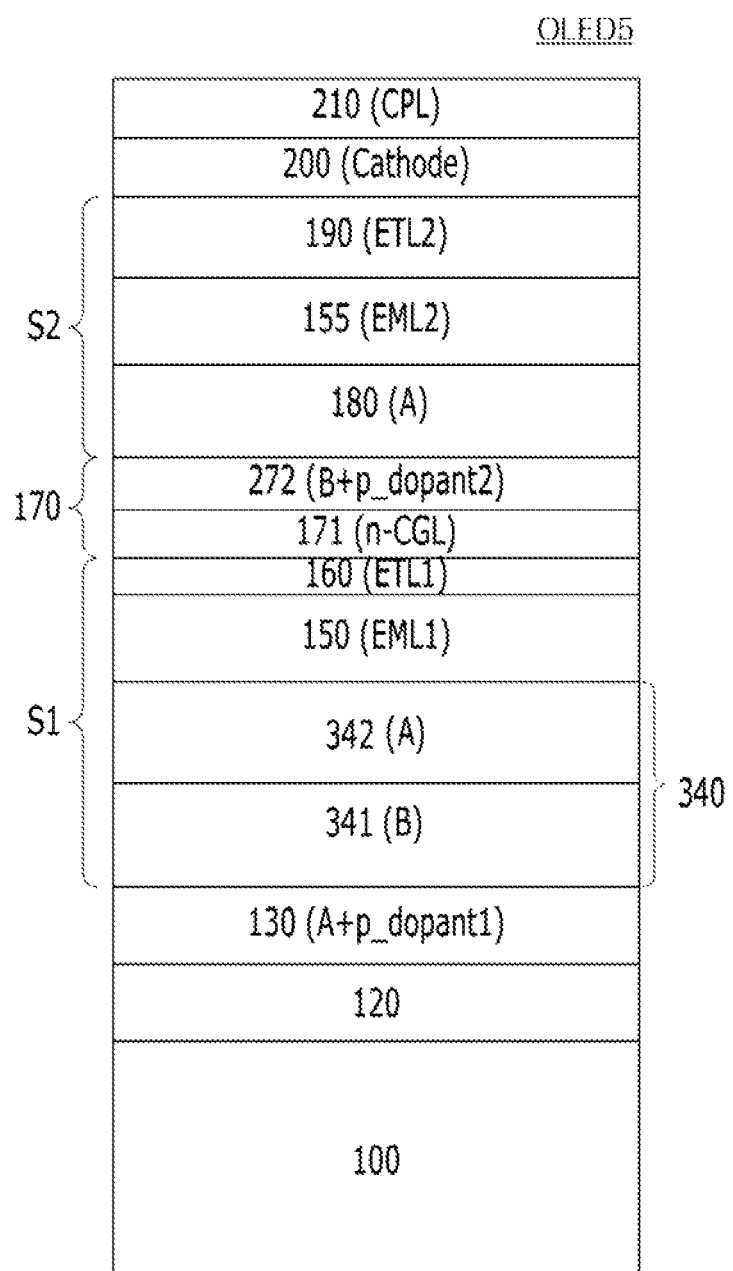
FIG. 7 is a cross-sectional view illustrating a light emitting device according to a fifth embodiment of the present invention.

FIG. 7 is a cross-sectional view illustrating a light emitting device according to a fifth embodiment of the present invention.

As shown in FIG. 7, a light emitting device OLED5 according to the fifth embodiment of the present invention has the same configuration as the light emitting device OLED1 according to the first embodiment, except that a first hole transport layer 340 of a first stack S1 contacting a hole injection layer 130 includes a plurality of layers 341 (B) and 342 (A), and a p-type charge generation layer 272 (B+p_dopant2) includes the second material B having high orientation regularity as a host.

The first and second layers 341 and 342 of the first hole transport layer 340 are the same as those of the light emitting device OLED4 according to the fourth embodiment of the present invention shown in FIG. 6, and a detailed description thereof will thus be omitted.

Figure 8:
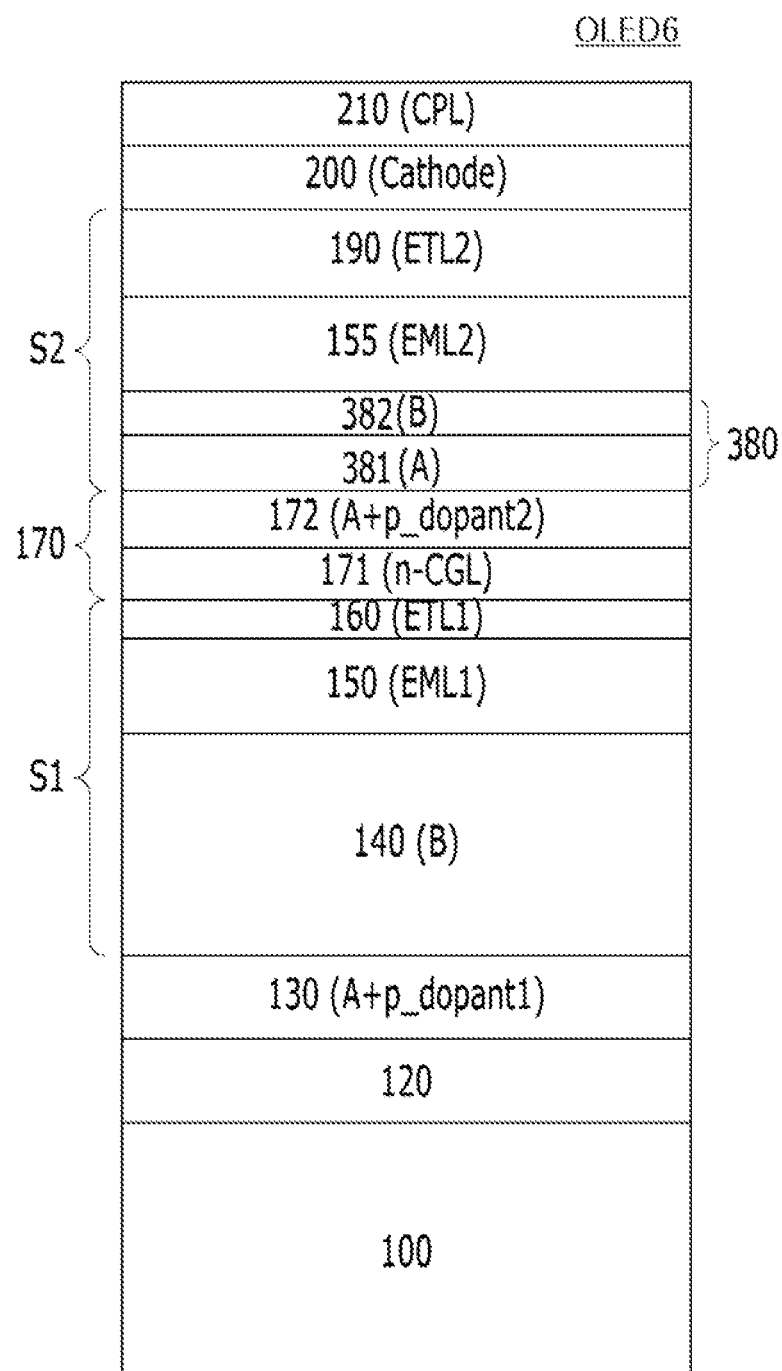
FIG. 8 is a cross-sectional view illustrating a light emitting device according to a sixth embodiment of the present invention.

FIG. 8 is a cross-sectional view illustrating a light emitting device according to a sixth embodiment of the present invention.

As shown in FIG. 8, a light emitting device OLED6 according to the sixth embodiment of the present invention has the same configuration as the light emitting device OLED1 according to the first embodiment, except that a second hole transport layer 380 of a second stack S2 contacting a p-type charge generation layer 172 includes a plurality of layers 381 (A) and 382 (B). Here, the second hole transport layer 380 is formed by sequentially stacking a first layer 381 including the first material A having low orientation regularity on the p-type charge generation layer 172 and a second layer 382 including the second material B having high orientation regularity on the first layer 381.

In this case, in the structure including a plurality of stacks, the p-type charge generation layer 172 and the first layer 381 of the second hole transport layer 380 include a material having low orientation regularity as a main material, thereby being capable of effectively preventing leakage current of the second stack S2. Simultaneously, the second layer 382 of the second hole transport layer 380 includes a material having high orientation regularity, thereby preventing an obstruction to current transmission in the vertical direction due to shortening of current transmission paths caused by the material having low orientation regularity included in the second stack S2.

Each of the light emitting devices OLED1 to OLED6 according to the first to sixth embodiments of the present invention enables the anode 120 thereof to be connected to a thin film transistor on the substrate 100, and can thus be driven in a corresponding one of the subpixels.

Hereinafter, a light emitting display device according to one or more embodiments of the present invention will be described by way of example.

Figure 9:
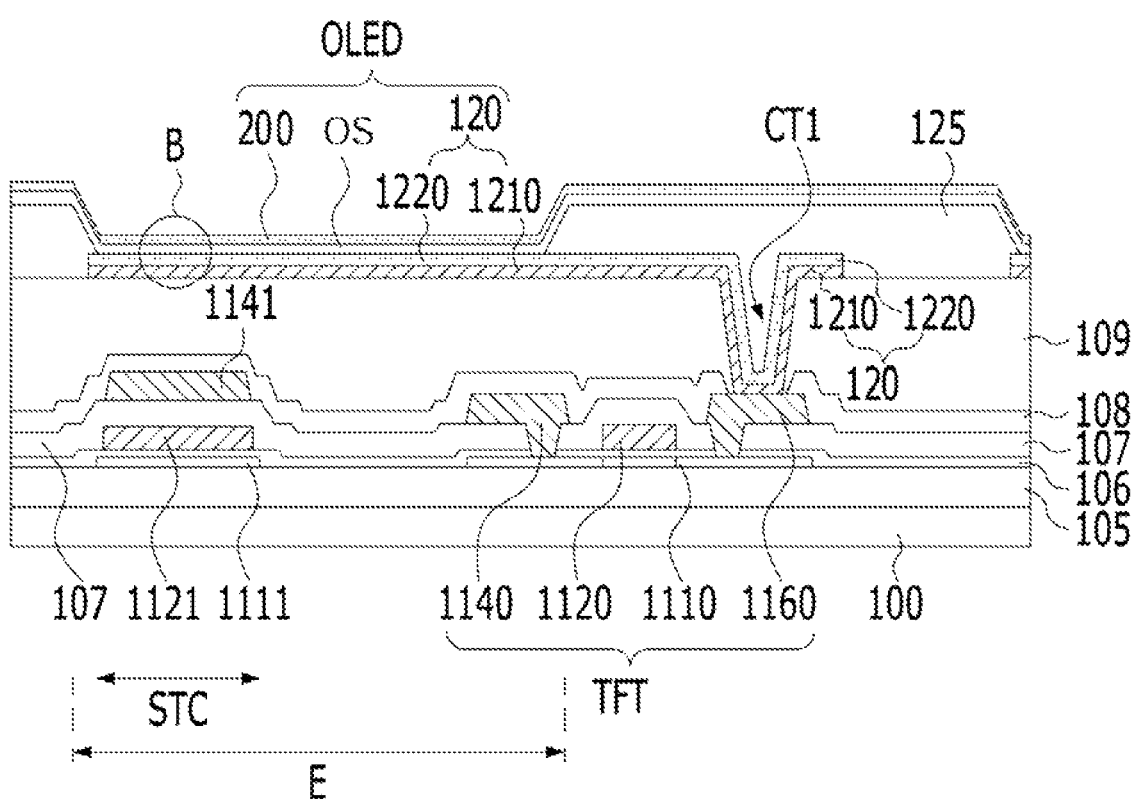
FIG. 9 is a cross-sectional view illustrating a light emitting display device according to the present invention.

FIG. 9 is a cross-sectional view illustrating a light emitting display device according to one or more embodiments of the present invention. All the components of the light emitting display device according to all embodiments of the present invention are operatively coupled and configured.

Referring to FIG. 9, the configuration of a thin film transistor TFT connected to the anode 120 of each of subpixels will be described.

A buffer layer 105 is provided on a substrate 100, and first and second semiconductor layers 1110 and 1111 are provided on the buffer layer 105. The buffer layer 105 functions to prevent impurities remaining on the substrate 100 from flowing into the first and second semiconductor layers 1110 and 1111. The first and second semiconductor layers 1110 and 1111 can be amorphous or crystalline silicon semiconductor layers, or transparent oxide semiconductor layers. Further, both sides of the first semiconductor layer 1110 respectively connected to a source electrode 1140 and a drain electrode 1160 can be regions into which impurities are injected, and an intrinsic region between the regions of the first semiconductor layer 1110, into which the impurities are injected, can function as a channel region.

The first and second semiconductor layers 1110 and 1111 can include at least one of an oxide semiconductor layer, a polysilicon layer and an amorphous silicon layer.

The second semiconductor layer 1111 can be located so as to overlap first and second storage electrodes 1121 and 1141 which will be formed thereon, and can be used as an auxiliary storage electrode to increase the capacity of a storage capacitor STC when impurities are injected. Otherwise, as circumstances require, the second semiconductor layer 1111 can be omitted.

Further, a gate insulating film 106 is provided so as to cover the first and second semiconductor layers 1110 and 1111, and a gate electrode 1120 and the first storage electrode 1121, which overlap the intrinsic region of the first semiconductor layer 1110 and the second semiconductor layer 1111, are formed.

A first interlayer insulating film 107 is provided so as to cover the first and second semiconductor layers 1110 and 1111, the gate electrode 1120 and the first storage electrode 1121.

Contact holes are formed on both sides of the first semiconductor layer 1110 by selectively removing the first interlayer insulating film 107 and the gate insulating film 106, and the source electrode 1140 and the drain electrode 1160 are connected to the first semiconductor layer 1110 through the contact holes. In the same process, the second storage electrode 1141 is formed on the first interlayer insulating film 107 at a position overlapping the first storage electrode 1121.

Here, the thin film transistor TFT for driving a light emitting device OLED provided in an emission part E includes the first semiconductor layer 1110, the gate electrode 1120 configured to overlap the intrinsic region of the first semiconductor layer 1110, and the source electrode 1140 and the drain electrode 1160 connected to both sides of the first semiconductor layer 1110, which are provided sequentially from below.

Further, the storage capacitor STC includes the first and second storage electrodes 1121 and 1141 which overlap each other with the first interlayer insulating film 107 interposed therebetween.

A second interlayer insulating film 108 is formed so as to cover the thin film transistor TFT and the storage capacitor STC.

Here, the thin film transistor TFT and the storage capacitor STC include light-shielding metal layers, and the anode 120 in the emission part E can include a reflective electrode 1210 so as to prevent lower wirings from being seen from outside. The anode 120 can be formed in a two-layer structure including the reflective electrode 1210 and a transparent electrode 1220 provided on the reflective electrode 1210, as shown in this figure, or can be formed in a three-layer structure including a reflective electrode and upper and lower transparent electrodes provided on the upper and lower surfaces of the reflective electrode.

The reflective electrode 1210 can prevent the metal layers disposed thereunder from being seen from outside in the emission part E, and a thick bank 125 can prevent elements disposed thereunder from being seen from outside in a region in which the bank 125 is located.

Further, a planarization film 109 can be formed so as to planarize the second interlayer insulating film 108 while covering the second interlayer insulating film 108, and the thin film transistor TFT can be connected to the anode 120 by a connection part CT1 formed by selectively removing the planarization film 109 and the second interlayer insulating film 108. Although FIG. 9 illustrates the anode 120 as having a two-layer structure including the reflective electrode 1210 and the transparent electrode 1220, the anode 120 can be formed in a three-layer structure including a reflective electrode and upper and lower transparent electrodes provided on the upper and lower surfaces of the reflective electrode. For example, the reflective electrode 1210 of the anode 120 can be formed of a reflective metal, for example, aluminum, an aluminum alloy, silver or a silver alloy, or in order to increase reflection efficiency, can be formed of an alloy such as Ag—Pd—Cu (APC).

Further, a cathode 200 provided opposite the anode 120 can be formed of a transflective metal, for example, a magnesium alloy, a silver alloy, silver, magnesium or MgAg. In some cases, the cathode 200 can be formed of a transparent metal, such as indium tin oxide (ITO) or indium zinc oxide (IZO).

The light emitting display device according to the present invention emits light through the cathode 200, and can further include the capping layer 210 provided on the cathode 200 of each of the light emitting devices OLED1 to OLED6 according to the first to sixth embodiments so as to increase the amount of emitted light.

Further, an organic stack OS between the anode 120 and the cathode 200 can have the same stack structure shown in FIG. 1 and FIGS. 4 to 8, except that colors of light emitted by the emission layers of the respective subpixels are different. For example, the hole injection layer 130, the first hole transport layer HTL1 and the first electron transport layer ETL1 of the first stack S1, the second hole transport layer HTL2 and the second electron transport layer ETL2 of the second stack S2, and the cathode 200 are provided in common.

A blue subpixel B-SP can have a plurality of stacks in which emission layers of the respective stacks are different.

Although FIG. 9 illustrates the organic stack OS as having a configuration provided in common throughout the emission parts E of the subpixels and the bank 125, at least emission layers are separately patterned in the respective emission parts E of blue subpixels B-SP, green subpixels G-SP and red subpixels R-SP which emits light of different colors.

The substrate 100 and a thin film transistor array formed on the substrate 100 can be referred to as a thin film transistor array substrate.

Hereinafter, the effects of First Example Ex2, in which the light emitting device OLED1 according to the first embodiment of FIG. 1 is applied to the light emitting display device of FIG. 9, Second Example Ex3, in which the light emitting device OLED2 according to the second embodiment of FIG. 4 is applied to the light emitting display device of FIG. 9, and Comparative Example, in which the second material B having high orientation regularity is applied to all of the hole injection layer, the first hole transport layer of the first stack, the p-type charge generation layer, and the second hole transport layer of the second stack in the structure of FIG. 1, will be described.

Figure 10A:
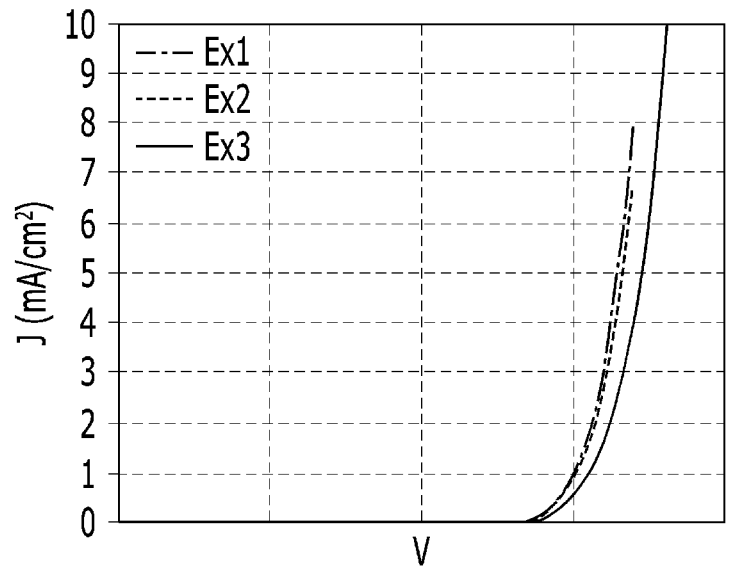
FIGS. 10A and 10B are graphs showing the relationships between driving voltage and current density when light emitting display devices according to Comparative Example Ex1 and First and Second Examples Ex2 and Ex3 are applied.
Figure 10B:
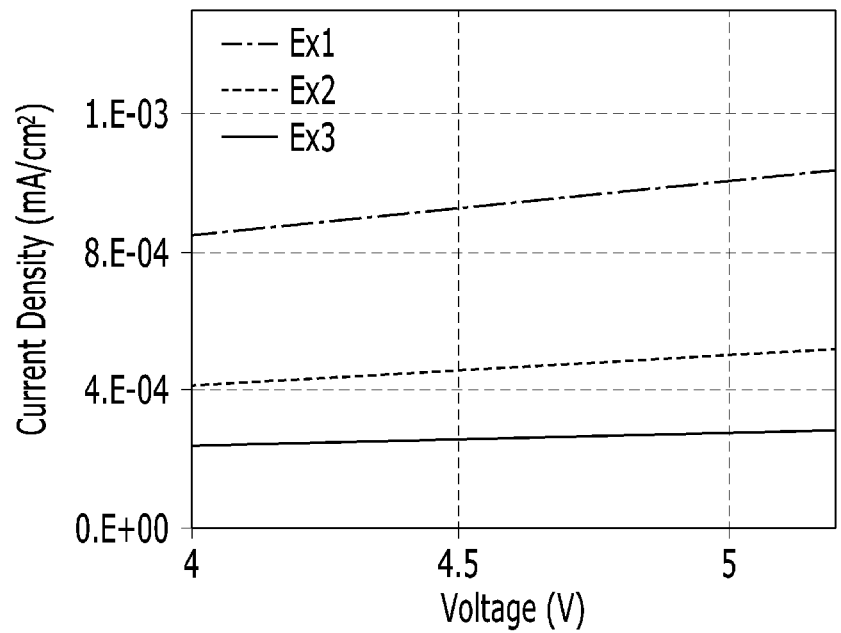

FIGS. 10A and 10B are graphs showing the relationships between driving voltage and current density when the light emitting display devices according to Comparative Example Ex1 and First and Second Examples Ex2 and Ex3 are applied.

TABLE 1

| Classification | Structure | | | | Driving voltage (V) | Efficiency (%) | Leakage current (mA/cm$^2$) |
| | HIL | HTL1 | p-CGL | HTL2 | | | |
| --- | --- | --- | --- | --- | --- | --- | --- |
| Comp. Examp. (Ex1) | B | B | B | B | — | 100 | 0.0009 |
| 1$^{st}$ Examp. (EX2) | A | B | A | A | +0.1 | 100 | 0.0003 |
| 2$^{nd}$ Examp. (EX3) | A | B | A | B | +0.05 | 100 | 0.0005 |

Referring to FIGS. 10A and 10B and Table 1, when the light emitting display devices according to Comparative Example Ex1 and First and Second Examples Ex2 and Ex3 exhibit the same efficiency, leakage current of 0.0009 mA/cm$^2$ occurs in the light emitting display device according to Comparative Example Ex1, whereas leakage currents of 0.0003 mA/cm$^2$ and 0.0005 mA/cm$^2$ respectively occur in the light emitting display devices according to First and Second Examples Ex2 and Ex3, and thereby, it can be confirmed that, when the first material A having low orientation regularity is applied at least to the hole injection layer and the p-type charge generation layer, leakage current is reduced. Further, even though leakage current is reduced, increases in driving voltage in the light emitting display devices according the First and Second Examples Ex2 and Ex3 are less than or equal to 0.1 V compared to the light emitting display device according to Comparative Example Ex1, and thus, considering that the turn-on voltage of the respective subpixels exceed 5 V, the light emitting display devices according to First and Second Examples Ex2 and Ex3 can have a leakage current prevention effect while changes in driving voltage in the light emitting display devices according to First and Second Examples Ex2 and Ex3 are insignificant. Here, the following effect can be acquired by preventing leakage current. For example, optical interference, in which, when the red subpixels are selectively driven to emit light, weak light emitted by the blue subpixels is visible due to leakage current, can be prevented.

Further, in order to examine the critical significance of the orientation factor S', Table 2 states driving voltages and leakage currents measured when all of the hole injection layer 130, the first hole transport layer 140, the p-type charge generation layer 172 and the second hole transport layer 180 of the structure shown in FIG. 1 are formed of various materials, i.e., a material B having an orientation factor S' of 0.89, a material C having an orientation factor S' of 0.79, and a material A having an orientation factor S' of 0.77. This is to examine the relationships between the orientation factors S' of the respective materials and leakage current regardless of requirements of respective layers, and driving voltage can increase even through the orientation factor S' of a material is low and thus the material have random orientation. The driving voltage can be adjusted by varying the materials of the respective layers, as set forth in Table 2 below.

It can be confirmed from Table 2 that when the materials C and A having orientation factors S' of less than or equal to 0.80 are used, leakage current values are low.

TABLE 2

| Material | S' | Leakage current (mA/cm$^2$) | Driving voltage (V) |
| --- | --- | --- | --- |
| B | 0.89 | 0.0010 | — |
| C | 0.79 | 0.0005 | +0.2 |
| A | 0.77 | 0.0003 | +0.2 |

Figure 11:
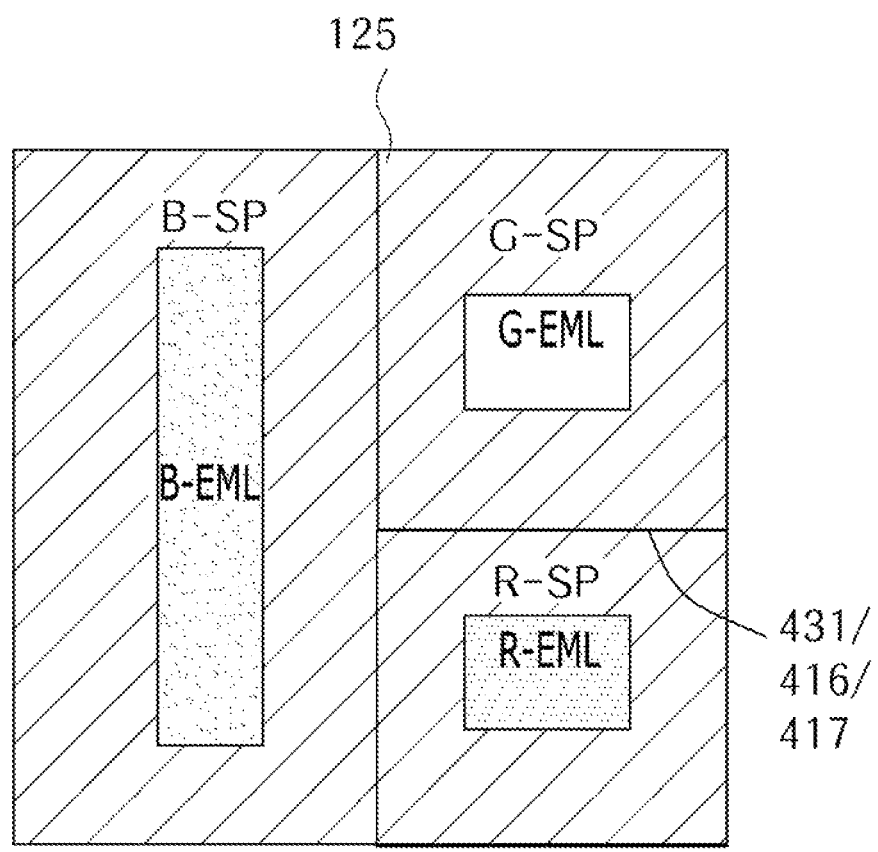
FIG. 11 is a plan view illustrating light emitting devices according to a seventh embodiment of the present invention.
Figure 12:
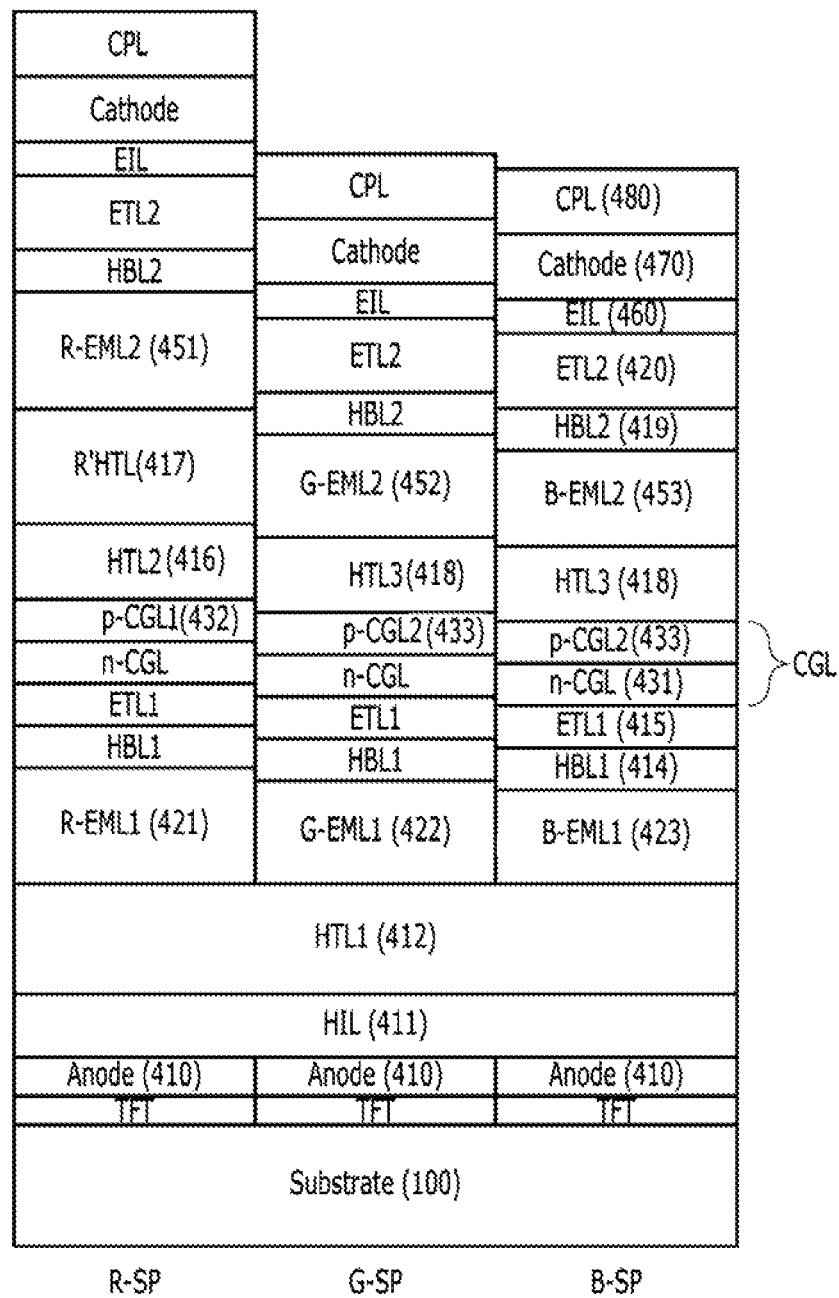
FIG. 12 is a cross-sectional view illustrating first to third subpixels shown in FIG. 11.
Figure 13A:
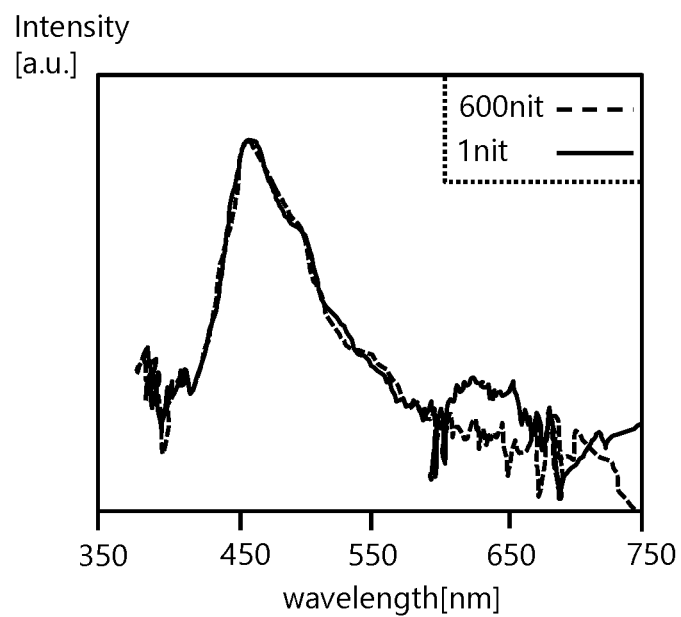
FIGS. 13A and 13B are graphs showing luminance according to wavelength when blue light is emitted at a low grayscale level and a high grayscale level, in the light emitting display devices according to the Comparative Example and the seventh embodiment of the present invention.
Figure 13B:
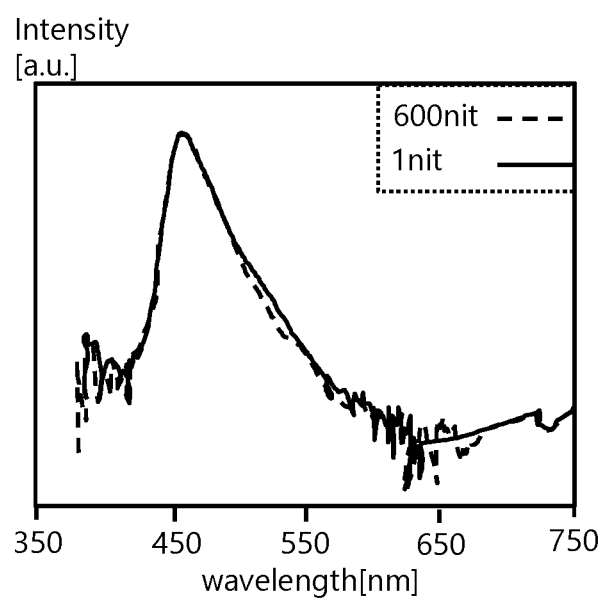

FIG. 11 is a plan view illustrating light emitting devices according to a seventh embodiment of the present invention, and FIG. 12 is a cross-sectional view illustrating firth to third subpixels shown in FIG. 11. FIGS. 13A and 13B are graphs showing luminance according to wavelength when blue light is emitted at a low grayscale level (1 nit) and a high grayscale level (100 nit), in the light emitting display devices according to Comparative Example and the seventh embodiment of the present invention.

In contrast to the above-described light emitting devices according to the first to sixth embodiments of the present invention, in the light emitting device according to the seventh embodiment of the present invention, layers causing leakage current are formed of different materials depending on respective subpixels, thereby solving causes of leakage current.

As shown in FIGS. 11 and 12, a light emitting display device including the light emitting devices according to the seventh embodiment of the present invention includes a substrate 100 including first to third subpixels R-SP (red subpixel), G-SP (green subpixel) and B-SP (blue subpixel), first to third anodes 410 respectively provided in the first to third subpixels R-SP, G-SP and B-SP, a cathode 470 provided throughout the first to third subpixels R-SP, G-SP and B-SP opposite the first to third anodes 410, and a first stack S1 and a second stack Sb2 divided from each other by an n-type charge generation layer 431 provided between the first to third anodes 410 and the cathode 470.

The light emitting display device further includes a first p-type charge generation layer 432 provided between the n-type charge generation layer 431 and the second stack S2 in the first subpixel R-SP, and a second p-type generation layer 433 provided between the n-type charge generation layer 431 and the second stack S2 so as to have an orientation factor S' less than that of the first p-type charge generation layer 432 in each of the second and third subpixels G-SP and B-SP, and each of the first to third subpixels R-SP, G-SP and B-SP includes corresponding ones of first color emission layers 421 and 451, second color emission layers 422 and 452 and third color emission layers 423 and 453.

Here, the turn-on voltage of the first subpixel R-SP including the first color emission layers 421 and 451 can be lower than the turn-on voltages of the second and third subpixels G-SP and B-SP respectively including the second color emission layers 422 and 452 and the third color emission layers 423 and 453.

Therefore, because the subpixels R-SP, G-SP and B-SP having a plurality of common layers are continuously provided in the structure having a plurality of stacks, even when the second or third subpixels G-SP or B-SP having high turn-on voltages are selectively turned on, if the common layers have high conductivity and high orientation regularity like in the light emitting display device according to Comparative Example, current flows laterally through the common layers, and thus the first subpixels R-SP having the first color emission layers 421 and 451 can be turned on.

In the light emitting display device according to the seventh embodiment of the present invention, the first subpixels R-SP and the second and third subpixels G-SP and B-SP are configured to have different orientation regularities. Here, the first subpixels R-SP include the first p-type charge generation layer 432 including a material having molecular arrangement having high orientation regularity as a host, and the second and third subpixels R-SP having relatively high turn-on voltage includes the second p-type charge generation layer 433 including a material having molecular arrangement having low orientation regularity (random orientation) as a host. The first and second p-type charge generation layers 432 and 433 can respectively include 0.1 wt % to 30 wt % of a p-type dopant in the hosts formed of the materials having the above-described molecular arrangements.

Further, the first subpixels R-SP can include a second hole transport layer 416 including a material having molecular arrangement having high orientation regularity and configured to contact the first p-type charge generation layer 431, and the second and third subpixels R-SP having relatively high turn-on voltage can include a third hole transport layer 418 including a material having molecular arrangement having low orientation regularity (random orientation) and configured to contact the second p-type charge generation layer 433.

Here, leakage current prevention effect can be realized only using any one of separation between the first and second p-type charge generation layers 432 and 433 and separation between the second and third hole transport layers 416 and 418. However, when both separations are applied to the first subpixels R-SP and the second and third subpixels G-SP and B-SP, leakage current can be more effectively controlled.

Although the above-described embodiment describes that the second subpixels G-SP and the third subpixels B-SP having high turn-on voltage include the material having low orientation regularity, the disclosure is not limited thereto. On the contrary, even though a material having low orientation regularity is applied to the first subpixels R-SP and a material having high orientation regularity is applied to the second and third subpixels G-SP and B-SP, leakage current can be controlled.

Here, the first subpixels R-SP can be red subpixels, the second subpixels G-SP can be green subpixels, and the third subpixels B-SP can be blue subpixels. However, the light emitting display device according to the present invention is not limited thereto, and, in order to prevent occurrence of leakage current between subpixels having different turn-on voltages, p-type charge generation layers including different materials and hole transport layers including different materials and configured to contact the p-type charge generation layers can be separately applied to the subpixels having the different turn-on voltages.

In the light emitting display device according to the seventh embodiment of the present invention, an auxiliary hole transport layer 417 can be further formed in the first subpixels R-SP so as to adjust the optical distance of the second stack S2. Because a subpixel configured to emit light with a relatively long wavelength requires a long optical distance, the auxiliary hole transport layer 417 can be formed only in the first subpixels R-SP among the subpixels R-SP, G-SP and B-SP. When the auxiliary hole transport layer 417 is formed only in the first subpixels R-SP, the first p-type charge generation layer 432, and the second hole transport layer 416 and the auxiliary hole transport layer 417 of the first subpixels R-SP can be formed of different materials in the same chamber. The first p-type charge generation layer 432, and the second hole transport layer 416 and the auxiliary hole transport layer 417 can include the same material, and in this case, the chamber can be provided with a shutter for a p-type dopant supplied when the first p-type charge generation layer 432 is formed.

In the second and third subpixels G-SP and B-SP, the second p-type charge generation layer 433 and the third hole transport layer 418 can be formed in common in the same chamber, and the chamber can be provided with a shutter for a p-type dopant supplied when the second p-type charge generation layer 433 is formed.

Between the anode 410 and the n-type charge generation layer 431 of each of the subpixels R-SP, G-SP and B-SP, a hole injection layer 411, a first hole transport layer 412, a corresponding one of the first to third color emission layers 421, 422 and 423, a first hole barrier layer 414 and a first electron transport layer 415 are provided. In some cases, the first hole barrier layer 414 can be omitted, or an electron barrier layer can be located between the first hole transport layer 412 and the corresponding one of the first to third color emission layers 421, 422 and 423.

In the first subpixel R-SP, the second stack S2 sequentially includes the second hole transport layer 416, the auxiliary hole transport layer 417, the first color emission layer 451, a second hole barrier layer 419, a second electron transport layer 420 and an electron injection layer 460, between the first p-type charge generation layer 432 and the cathode 470. The electron injection layer 460 is formed of a metal dopant or a dopant including an inorganic component by the same process as the cathode 470, and in some cases, the electron injection layer 460 can be considered as one layer among layers which are stacked to form the cathode 470.

In the second or third subpixel G-SP or B-SP, the second stack S2 sequentially includes the third hole transport layer 418, the second or third color emission layer 452 or 453, the second hole barrier layer 419, the second electron transport layer 420 and the electron injection layer 460, between the second p-type charge generation layer 433 and the cathode 470.

In the light emitting display device according to the seventh embodiment of the present invention, the first or second p-type charge generation layer 432 or 433 is formed together with the second hole transport layer 416 and/or the auxiliary hole transport layer 417 in each subpixel, and thus, the first or second p-type charge generation layer 432 or 433 can be formed without increasing the number of masks, and in some cases, the first p-type charge generation layer 432, the second hole transport layer 416, the auxiliary hole transport layer 417 and the first color emission layer 451 can be formed using the same mask, such that they are formed of respective materials using shutters. Therefore, even though the p-type charge generation layer and the hole transport layer and/or the auxiliary hole transport layer varies depending on the subpixels, the number of masks is not increased and thus yield is not deteriorated.

For example, the orientation factor S' of the first p-type charge generation layer 432 can be greater than or equal to 0.82, may be greater than or equal to 0.84, and the orientation factor S' of the second p-type charge generation layer 433 can be less than or equal to 0.8.

For example, the orientation factor S' of the second hole transport layer 416 can be less than or equal to 0.8.

The second p-type charge generation layer 433 can include a material having low orientation regularity, for example, fluorene, as a host, and the first p-type charge generation layer 432 can include a material having high orientation regularity, for example, at least one of carbazole, dibenzofuran and biphenyl, as a host.

In the light emitting display device according to the seventh embodiment of the present invention, as the p-type charge generation layer of the charge generation layer configured to divide the first and second stacks S1 and S2 from each other, the first and second p-type charge generation layers 432 and 433 are separately applied to the corresponding subpixels, and the second and third hole transport layers 416 and 418 contacting the first and second p-type charge generation layers 432 and 433 are separately applied also to the corresponding subpixels, and the reason for this is as follows.

A structure having a plurality of stacks is excellent in terms of efficiency compared to a structure having a single stack, but because two or more stacks are stacked, the amount of a p-type dopant introduced into a p-type charge generation layer must be greater than or equal to a designated concentration in order to effectively supply a sufficient amount of holes to the hole transport layer of a second stack disposed far away from an electrode. Because this p-type dopant has high electrical conductivity and thus causes leakage current, the light emitting display device according to the seventh embodiment of the present invention is configured such that different p-type charge generation layers and different hole transport layers of the second stack contacting the p-type charge generation layers are separately applied to subpixels having high turn-on voltage and subpixels having relatively low turn-on voltage, thereby structurally preventing transmission of leakage current to adjacent subpixels.

In the light emitting display device according to the seventh embodiment of the present invention and a light emitting display device according to the Comparative Example in which both the charge generation layer and the hole transport layer contacting the charge generation layer are formed of a material having high orientation regularity, the blue subpixels of the two light emitting display devices were selectively driven at a high grayscale level (600 nit) and a low grayscale level (1 nit) and thus the intensities of light emitted by the respective blue subpixels were measured.

TABLE 3

| Classification | Color coordinates at 600 nit | Color coordinates at 1 nit |
| --- | --- | --- |
| Comparative example | (0.137, 0.048) | (0.154, 0.060) |
| Seventh embodiment | (0.138, 0.047) | (0.140, 0.049) |

As set forth in Table 3, it can be confirmed that there is no significant difference between the color coordinates of the light emitted by the blue subpixels according to the Comparative Example and the seventh embodiment at the high grayscale level (600 nit), and normal blue light is emitted. However, as shown in FIG. 13A, at the low grayscale level (1 nit), leakage of light occurs in the red wavelength range, and thus the color coordinates are changed, as set forth in Table 3. This means that, when blue light is emitted at the low grayscale level, the color coordinates of the blue light are changed due to weak red light leakage, and such leaked light is visible.

The light emitting display device according to the seventh embodiment of the present invention blocks such light leakage, thereby being capable of improving visibility of blue light at the low grayscale level.

For this purpose, a light emitting display device according to one embodiment of the present invention can include a substrate configured to have a plurality of subpixels, an anode provided in each of the subpixels, a cathode provided throughout the subpixels opposite the anode, a first stack and a second stack provided between the anode and the cathode so as to be divided by a charge generation layer and configured such that each of the first and second stack includes an emission layer, and a hole injection layer provided between the anode and the first stack so as to contact the anode and to have an orientation factor S' of less than or equal to 0.8, wherein the first stack includes a first hole transport layer configured to contact the hole injection layer and to have an orientation factor S' of greater than or equal to 0.9.

The charge generation layer can include an n-type charge generation layer and a p-type charge generation layer, stacked sequentially, and the p-type charge generation layer can include a p-type dopant and a host having an orientation factor S' of less than or equal to 0.8.

The second stack can further include a second hole transport layer provided between the charge generation layer and the emission layer of the second stack so as to contact the charge generation layer and to have an orientation factor S' of less than or equal to 0.8.

The light emitting display device can further include a third hole transport layer provided between the second hole transport layer and the emission layer of the second stack so as to contact the second hole transport layer and to have an orientation factor S' exceeding 0.84.

The first stack can further include a third hole transport layer configured to contact an upper surface of the first hole transport layer and to have an orientation factor S' of less than or equal to 0.8.

The emission layer of the first stack and the emission layer of the second stack in each of the subpixels can emit light of the same color.

The hole injection layer can include a p-type dopant.

A light emitting display device according to one embodiment of the present invention can include a substrate configured to have first to third subpixels, first to third anodes respectively provided in the first to third subpixels, a cathode provided throughout the first to third subpixels opposite the first to third anodes, a first stack and a second stack divided from each other by an n-type charge generation layer provided between the first to third anodes and the cathode, a first p-type charge generation layer provided between the n-type charge generation layer and the second stack in the first subpixel, and a second p-type generation layer provided between the n-type charge generation layer and the second stack in each of the second and third subpixels so as to have an orientation factor S' less than an orientation factor S' of the first p-type charge generation layer, wherein each of the first to third subpixels includes corresponding ones of first color emission layers, second color emission layers and third color emission layers in the first stack and the second stack, and the turn-on voltage of the first subpixel is lower than the turn-on voltages of the second and third subpixels.

The orientation factor S' of the first p-type charge generation layer can be greater than or equal to 0.82, and the orientation factor S' of the second p-type generation layer can be less than or equal to 0.8.

The second stack of the first subpixel can include a first hole transport layer configured to contact the first p-type charge generation layer, and each of the second stacks of the second and third subpixels can include a second hole transport layer configured to contact the second p-type charge generation layer and to have an orientation factor S' less than an orientation factor S' of the first hole transport layer.

The orientation factor S' of the second hole transport layer can be less than or equal to 0.8.

The light emitting display device can further include an auxiliary hole transport layer provided between the first hole transport layer and the first color emission layer of the second stack, in the second stack of the first subpixel, and the first p-type charge generation layer, the first hole transport layer and the auxiliary hole transport layer can have the same width.

The second p-type charge generation layer and the second hole transport layer can have the same width.

The second p-type charge generation layer can include fluorene, and the first p-type charge generation layer can include at least one of carbazole, dibenzofuran and biphenyl.

As is apparent from the above description, a light emitting display device according to the present invention has the following effects.

First, a hole injection layer disposed adjacent to an anode and including a dopant having hole injection characteristics includes a host having random orientation, thereby enabling the host having random orientation, thereby being capable of preventing lateral leakage current.

Second, a hole transport layer provided to contact the hole injection layer having random orientation is configured to have high orientation, thereby being capable of stably transmitting current in the vertical direction of a stack and thus preventing an increase in driving voltage in an organic stack structure.

Third, a p-type charge generation layer includes a host having random orientation, thereby enabling the host having random orientation to prevent lateral leakage current.

Fourth, a plurality of subpixels configured to emit light of different colors is divided into a first subpixel including a color emission layer having low turn-on voltage and second subpixels respectively including color emission layers having relatively high turn-on voltage, and a p-type charge generation layer and/or a hole transport layer having random orientation are applied to the second subpixels rather than the first subpixel, thereby enabling the p-type charge generation layer and/or the hole transport layer having random orientation to prevent transmission of leakage current from the second subpixels to the first subpixel.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting display device comprising:
a substrate including a plurality of subpixels;
an anode provided in each of the subpixels;
a cathode provided throughout the subpixels opposite the anode;
a first stack and a second stack provided between the anode and the cathode, and separated from each other by a charge generation layer, each of the first stack and the second stack including an emission layer; and
a hole injection layer provided between the anode and the first stack, and being in contact with the anode,
wherein the hole injection layer contacts a first hole transport layer of the first stack, and an orientation factor S' of the hole injection layer is less than an orientation factor S' of the first hole transport layer.

2. The light emitting display device according to claim 1, wherein:
the orientation factor S' of the hole injection layer is less than or equal to approximately 0.8; and
the orientation factor S' of the first hole transport layer exceeds approximately 0.8.

3. The light emitting display device according to claim 1, wherein:
the hole injection layer comprises fluorene; and
the first hole transport layer comprises at least one of carbazole, dibenzofuran and biphenyl.

4. The light emitting display device according to claim 1, wherein the charge generation layer comprises an n-type charge generation layer and a p-type charge generation layer, stacked sequentially, and
wherein the p-type charge generation layer comprises a p-type dopant and a host having an orientation factor S' of less than or equal to approximately 0.8.

5. The light emitting display device according to claim 1, wherein the second stack further comprises a second hole transport layer between the charge generation layer and the emission layer of the second stack,
the second hole transport layer contacting the charge generation layer and having an orientation factor S' of less than or equal to approximately 0.8.

6. The light emitting display device according to claim 5, further comprising a third hole transport layer between the second hole transport layer and the emission layer of the second stack,
the third hole transport layer contacting the second hole transport layer and having an orientation factor S' exceeding approximately 0.80.

7. The light emitting display device according to claim 1, wherein the first stack further comprises a third hole transport layer to contact an upper surface of the first hole transport layer and to have an orientation factor S' of less than or equal to approximately 0.8.

8. The light emitting display device according to claim 1, wherein the emission layer of the first stack and the emission layer of the second stack in each of the subpixels emit light of a same color.

9. The light emitting display device according to claim 1, wherein the hole injection layer comprises a p-type dopant.

10. A light emitting display device comprising:
a substrate including a first subpixel, a second subpixel and a third subpixel;
a first anode, a second anode and a third anode respectively provided in the first to third subpixels;
a cathode provided throughout the first to third subpixels opposite the first to third anodes;
a first stack and a second stack separated by an n-type charge generation layer, and provided between the first to third anodes and the cathode;
a first p-type charge generation layer between the n-type charge generation layer and the second stack, in the first subpixel; and
a second p-type charge generation layer provided between the n-type charge generation layer and the second stack, in each of the second and third subpixels, the second p-type charge generation layer to have an orientation factor S' less than an orientation factor S' of the first p-type charge generation layer,
wherein the first subpixel comprises first color emission layers, the second subpixel comprises second color emission layers and the third subpixel comprises third color emission layers, in the first stack and the second stack, respectively.

11. The light emitting display device according to claim 10, wherein a turn-on voltage of the first subpixel is lower than turn-on voltages of the second and third subpixels.

12. The light emitting display device according to claim 10, wherein the orientation factor S' of the first p-type charge generation layer is greater than or equal to approximately 0.84, and the orientation factor S' of the second p-type generation layer is less than or equal to approximately 0.8.

13. The light emitting display device according to claim 10, wherein:
the second stack of the first subpixel comprises a first hole transport layer to contact the first p-type charge generation layer; and
each of the second stacks of the second and third subpixels comprises a second hole transport layer to contact the second p-type charge generation layer and to have an orientation factor S' less than an orientation factor S' of the first hole transport layer.

14. The light emitting display device according to claim 13, wherein the orientation factor S' of the second hole transport layer is less than or equal to approximately 0.8.

15. The light emitting display device according to claim 13, further comprising an auxiliary hole transport layer between the first hole transport layer and the first color emission layer, in the second stack of the first subpixel,
wherein the first p-type charge generation layer, the first hole transport layer and the auxiliary hole transport layer have a same width.

16. The light emitting display device according to claim 13, wherein the second p-type charge generation layer and the second hole transport layer have a same width.

17. The light emitting display device according to claim 10, wherein:
the second p-type charge generation layer comprises fluorene; and
the first p-type charge generation layer comprises at least one of carbazole, dibenzofuran or biphenyl.

* * * * *